United States Patent [19]

Bibring et al.

[11] 4,043,841
[45] Aug. 23, 1977

[54] METAL-REFRACTORY COMPOSITE MATERIAL

[75] Inventors: Hervé Bibring, Meudon; Jean-Pierre Trottier, Bagneux; Tasadduq Khan, Plessis-Robinson; Maurice Rabinovitch, Chatillon; Jean-François Stohr, Bourg-la-Reine, all of France

[73] Assignee: O.N.E.R.A. - Office National d'Etudes et de Recherches Aerospatiales, Chatillon, France

[21] Appl. No.: 608,346

[22] Filed: Aug. 27, 1975

[30] Foreign Application Priority Data

Sept. 13, 1974 France .................. 74.31140

[51] Int. Cl.$^2$ .................................. C22C 19/05
[52] U.S. Cl. .................................. 148/32.5; 75/171
[58] Field of Search ............. 75/171, 170; 148/32, 148/32.5

[56] References Cited

U.S. PATENT DOCUMENTS

| | | | |
|---|---|---|---|
| 3,677,835 | 7/1972 | Tien et al. | 75/171 |
| 3,799,769 | 3/1974 | Tarshis et al. | 75/171 |

*Primary Examiner*—R. Dean
*Attorney, Agent, or Firm*—Karl F. Ross; Herbert Dubno

[57] ABSTRACT

A refractory composite material usable in making gas-turbine blades for aviation applications. The composite material comprises a nickel-based superalloy matrix containing cobalt, aluminum in the form of a $Ni_3Al$ precipitate, and tungsten, and a reinforcing phase of oriented monocrystalline niobium carbide fibers formed in situ during production, by unidirectional solidification. The composition of the composite material by weight expressed in percent is:

Co — 20-30%
Cr — 6-15%
W — 7-10%
Al — 3-6%
Nb — 4-6%
C — 0.4-0.65%
Ni balance to 100.

8 Claims, No Drawings

METAL-REFRACTORY COMPOSITE MATERIAL

The present invention relates to a metal refractory composite material obtained by unidirectional solidification and constituted by a nickel-based superalloy matrix and oriented metal carbide fibers.

U.S. Pat. No. 3,871,835 and G.B. Specification No. 1,303,160 describe refractory composite material obtained by unidirectional solidification.

These composite materials are composed of a cobalt-, nickel or iron-based complex matrix with monocrystalline reinforcing fibers of transition-metal carbides (TaC, NbC, TiC, VC, ZrC, etc.).

Generally speaking, known composite materials are somewhat sensitive to temperature variations since the coefficient of expansion of the matrix and of the fibers are somewhat different. When the composite material is subjected to temperature variations, this results in internal stresses that can cause plastic deformation of the matrix when the temperature variations are great.

It is thus an object of the invention to provide a composite material for making parts of low sensitivity to repeated variations in temperature, or thermal cycling, even with mechanical stressing.

It is also an object of the invention to provide a composite material which is specially adapted for use in making the movable blades of a gas turbine for aviation applications, which aviation turbine blades are subjected to repeated variations in temperature owing to the mode of operation of motors, repeatedly started and stopped, the resulting cumulative plastic deformations tending to bring about the early rupture of earlier composite material.

Accordingly, another object of the invention is to provide a composite material in which the effect of the difference between the coefficients of expansion of the fibers and the matrix is minimized.

In this respect a still further object of the invention is the provision of a composite material in which the matrix has a high elastic limit, and the invention contemplates in this respect a matrix made of a nickel-based superalloy precipitation hardened by the formation of $Ni_3Al$ type $\gamma'$ compound.

With the same object of avoiding plastic deformations of the matrix under the effect of the repeated variations in temperature, in mind, the invention provides a hardening of the solid solution matrix by the addition of tungsten.

The invention does not exclude hardening obtained by precipitation in the heart of the matrix of a small fraction of the car on constituting the fibers.

Yet another object of the invention is to provide a composite material whose specific gravity is relatively low with a view to limiting stresses in parts subjected to centrifugal force such as in turbine blades.

The desired specific gravity for superalloys currently in use for the construction of aviation turbine blades is less than 9.

In order to obtain a composite material having a specific gravity less than 9, the invention provides as the carbide constituting the fibers a carbide of low specific gravity, such as niobium carbide (NaC) which compensates for the increase in the specific gravity due to the addition of tungsten.

Another object of the invention is to provide a metallic composite material having a creep resistance at high temperature (1000° to 1100° C) which is substantially greater than that of the finest known superalloys. This property is achieved in particular according to the invention by the presence of niobium monocarbide fibers making up a sufficient part of the volume of the composite material, viz. approximately 6%.

But it has been found that the addition of aluminum, required for hardening the matrix, produces a displacement of the equilibrium point of the solidification reaction and leads to a decrease in the volumetric fraction of fibers in the matrix.

It is a feature of the invention, in order to obtain a sufficient volumetric fraction of niobium carbide in the fibers so as to compensate for the effect produced by the presence of aluminum to provide cobalt as a constituent element of the matrix.

It has been discovered that the presence of cobalt in the starting alloy increases the volumetric fraction of the fibers in the matrix.

Another aspect of the invention calls for the presence of chromium in the matrix for conferring to the material high oxidation resistance at high temperature.

According to the invention a refractory composite material is provided comprising a nickel-based matrix containing chromium, tungsten, cobalt and aluminum, reinforced by fibers of niobium monocarbide.

The composite material according to the invention benefits from the flexibility conferred by the possibility of adding large amounts of elements other than those of the basic pseudo-binary eutectic system defined in the aforementioned Patent which in the present case is a Ni-NbC system.

The polyvariant alloys according to the invention have a two-phase eutectic structure and have the small solidification internal which is compatible with a progression of the solidification along a frontal plane.

The composite materials according to the invention have compositions by weight expressed in percent within the following limits:

Co – 20 - 30
Cr – 6 - 15
W – 7 - 10
Al – 3 - 6
Nb – 4 - 6
C – 0.4 - 0.65
Ni – balance to 100.

These composite materials are insensitive to repeated variations in temperature up to 1100° C, under stress.

The creep strength at an average temperature (800° C) is equivalent to that of the best nickel-based superalloys now in use.

The mechanical properties of these composite materials between 1000° and 1100° C are very much better than those of the best superalloys.

The specific gravity of the composite materials is of the order of 8.5 which is comparable to that of a superalloy.

Their capacity to withstand high temperature oxidation is enhanced.

The following tables define a number of composite materials according to the invention:

Table I concerns high temperature tensile tests.

The composition is given in the first column. The listing of nickel ahead of all the other constituents is intended to signify that the corresponding composite material is nickel-based. The number preceding the chemical symbol of every following alloying element signifies the percentage, by weight, thereof.

In the second column is given the specific gravity of each composite material.

In the third column is indicated the speed of forward progression of the solidification front during production of the test piece.

The fourth, fifth and sixth columns concern the tests applied to the composite materials. The fourth column shows the test temperature in Celsius, the fifth the tensile strength or ultimate strength of the test piece, and the sixth column the elongation of the test pieces at rupture.

Table I

| Composition | Specific Gravity | vel. (Cm/h) | Temp. °C | Tensile Strength (MN/m2) | E-longation |
|---|---|---|---|---|---|
| Ni, 20Co, 10Cr, 10W, 3Al, NbC | 8.6 | 1.2 | 1070 | 280 | 2.67 |
| Ni, 20Co, 15Cr, 10W, 3Al, NbC | 8.5 | 1.2 | 1070 | 290 | 3.50 |
| Ni, 20Co, 10Cr, 10W, 4Al, NbC | 8.5 | 1.2 | 1070 | 300 | 3.50 |
| Ni, 20Co, 10Cr, 10W, 5Al, NbC | 8.4 | 1.2 | 1070 | 315 | 4.82 |
| Ni, 20Co, 10Cr, 10W, 5Al, NbC | 8.4 | 1.6 | 1070 | 326 | 4.00 |
| Ni, 30Co, 15Cr, 7,5W, 3Al, NbC | 8.5 | 1.2 | 1070 | 300 | 3.67 |
| Ni, 30Co, 15Cr, 10W, 3Al, NbC | 8.6 | 1.2 | 1070 | 305 | — |

Table II concerns creep tests.

The compositions of the test composite materials are set out in the first column. The fact that nickel is mentioned first each time signifies that the composite material is nickel-based. The number preceding the chemical symbol of each other alloying element signifies the percentage, by weight, of the corresponding element.

In the second column is given the specific gravity of each composite material.

The third column indicates the speed of forward progression of the solidification front during production of the test piece.

The fourth, fifth and sixth columns concern the creep tests per se. The fouth column gives the temperature in Celsius at which each test was carried out. The fifth column gives the load to which the test piece was subjected. And the sixth and last column shows the time in hours of the test until the rupture of the test piece.

For certain test pieces, rupture could not be attained.

Table II

| Composition | Specific Gravity | Vel. (Cm/h) | Temp. °C | Stress applied (MN/m2) | Duration (hours) |
|---|---|---|---|---|---|
| Ni, 20Co, 10Cr, 10W, 3Al, NbC | 8.6 | 1.6 | 800 | 400 | >1200 |
| Ni, 20Co, 10Cr, 10W, 4Al, NbC | 8.5 | 1.2 | 800 | 400 | >1000 |
|  | 8.5 | 1.2 | 800 | 450 | > 450 |
| Ni, 20Co, 10Cr, 10W, 4Al, NbC | 8.5 | 1.2 | 900 | 240 | 904 |
| Ni, 20Co, 10Cr, 10W, 3Al, NbC | 8.6 | 1.6 | 900 | 270 | 153 |
| Ni, 20Co, 10Cr, 10W, 4Al, NbC | 8.5 | 1.2 | 1000 | 140 | 620 |
| Ni, 30Co, 15Cr, 10W, 3Al, NbC | 8.6 | 1.6 | 1000 | 180 | 212 |
| Ni, 20Co, 10Cr, 10W, 4Al, NbC | 8.5 | 1.2 | 1070 | 120 | 600 |
| Ni, 20Co, 15Cr, 10W, 3Al, NbC | 8.5 | 1.6 | 1070 | 120 | >3000 |
| Ni, 20Co, 10Cr, 10W, 6Al, NbC | 8.3 | 1.6 | 1070 | 120 | > 400 |

This table shows that at moderately high temperatures the creep strength of the composite materials according to the invention are equivalent to those of known good superalloys.

At high tempertures (1070° C) the performances of the composite materials according to the invention were very much better than the best known superalloys.

Whereas the preceding table shows the results of creep test at constant temperature, the following Table III shows the results of creep tests carried out with repeated temperature variations.

The first column of Table III shows once again the elemental composition of composite materials according to the invention. The second column indicates the speed of forward progression of the solidification front during production of the test piece. The third column indicates the maximum and minimum temperature of each temperature cycle.

In Table III the temperature cycle for the first test lasted three minutes with the temperature being maintained at the maximum temperature for two minutes.

For other tests, the cycle lasted 30 minutes and the temperature was maintained at the maximum temperature for 28 minutes.

The fourth column indicates the load to which the test pieces were subjected.

The fifth column indicates the total creep time at the maximum temperature for 30-minute test cycles.

However, for the first composition, the figures indicated corresponds to the number of three-minute cycles to which the test piece was subjected up to rupture.

The total creep time up to rupture in cyclical temperature creep tests is practically the same as the total time in constant temperature creep tests.

From the next table, it appears that the composite materials are insensitive to repeated variations in temperatures up to at least 1100° C.

Table III

| Composition | v (Cm/h) | Temp. (° C) | Stress applied (MN/m2) | Duration |
|---|---|---|---|---|
| Ni, 20Co, 10Cr, 10W, 3Al, NbC | 1.25 | 1070/250 | 120 | 5840 cycles |
| Ni, 20Co, 15Cr, 10W, 3Al, NbC | 1.2 | 1070/250 | 120 | 507 hours |
| Ni, 30Co, 15Cr, 10W, 3Al, NbC | 1.25 | 1070/250 | 120 | 1005 hours |
| Ni, 20Co, 10Cr, 10W, 4Al, NbC | 1.2 | 1070/250 | 120 | 265 hours |
| Ni, 20Co, 10Cr, 10W, 4Al, NbC | 1.2 | 1100/250 | 100 | 395 hours |
| Ni, 20Co, 10Cr, 10W, 3Al, NbC | 1.25 | 1100/250 | 80 | 1061 hours |

The next and last table gives, by way of example the results of tensile tests for the composite material Ni, 20Co, 10Cr, 10W, 4Al, NbC subjected to heat treatment for one hour at 1100° C in air and then for 120 hours at 760° C in air.

| Temperature (° C) | Tensile Strength (MN/m2) | Elongation (%) |
|---|---|---|
| Ambient | 1550 | 13 |
| 700 | 1240 | 7.5 |
| 900 | 680 | 7.7 |
| 1000 | 415 | 6.6 |
| 1070 | 300 | 3.5 |

What we claim is:

1. A refractory composite material adapted to be used particularly in the manufacture of aviation turbine blades, comprising a nickel-based superalloy matrix consisting essentially of nickel, cobalt, aluminum, in the form of Ni₃Al precipitate, and 7 to 10% by weight tungsten; and a reinforcing phase of oriented monocrystalline niobium carbide fibers formed in situ during production of the material by unidirectional solidification, said composite material having a density of less than 9 and a composition by weight of:

Co — 20 to 30%
Cr — 6 to 15%
W — 7 to 10%
Al — 3 to 6%
Nb — 4 to 6%
C — 0.4 to 0.65%
Ni — balance to 100.

2. The composite material according to claim 1 having the following % by weight composition:

Co — 20%
Cr — 10%
W — 10%
Al — 3%
Nb — 4-6%
C — 0.4-0.65%
Ni — balance to 100.

3. The composite material according to claim 1, having the following % by weight composition:

Co — 20%
Cr — 15%
W — 10%
Al — 3%
Nb — 4-6%
C — 0.4-0.65%
Ni — balance to 100.

4. The composite material according to claim 1, having the following % weight composition:

Co — 30%
Cr — 15%
W — 10%
Al — 3%
Nb — 4-6%
C — 0.4-0.65%
Ni — balance to 100.

5. The composite material according to claim 1, having the following % weight composition:

Co — 20%
Cr — 10%
W — 10%
Al — 4%
Nb — 4-6%
C — 0.4-0.65%
Ni — balance to 100.

6. The composite material according to claim 1, having the following % weight composition:

Co — 20%
Cr — 10%
W — 10%
Al — 5%
Nb — 4-6%
C — 0.4-0.65%
Ni — balance to 100.

7. The composite material according to claim 1, having the following % weight composition:

Co — 20%
Cr — 10%
W — 10%
Al — 6%
Nb — 4-6%
C — 0.4-0.65%
Ni — balance to 100.

8. The composite material according to claim 1, having the following % weight composition:

Co — 30%
Cr — 15%
W — 7.5%
Al — 3%
Nb — 4-6%
C — 0.4-0.65%
Ni — balance to 100.

* * * * *